United States Patent [19]

Swanson

[11] 4,378,539

[45] Mar. 29, 1983

[54] LINE CHOKE

[75] Inventor: Carl R. Swanson, Des Plaines, Ill.

[73] Assignee: Zenith Radio Corporation, Glenview, Ill.

[21] Appl. No.: 259,312

[22] Filed: Apr. 30, 1981

[51] Int. Cl.³ .............................................. H03H 7/09
[52] U.S. Cl. ...................................... 333/177; 333/12; 333/181; 333/185
[58] Field of Search ............... 333/167, 177, 181, 185, 333/12; 336/110, 181, 188, 220, 221, 225, DIG. 4

[56] References Cited

U.S. PATENT DOCUMENTS 3,683,271  8/1972  Kobayashi ...................... 336/181 X
4,342,013  7/1982  Kallman .............................. 333/181

FOREIGN PATENT DOCUMENTS 327570  3/1972  U.S.S.R. ............................. 333/177

Primary Examiner—Marvin L. Nussbaum

[57] ABSTRACT

A line choke is disclosed for use in attenuating interfering emissions on a power line. The choke includes a ferrite core having four holes extending through it. A pair of windings are threaded through the holes and around the center of the core so that the windings crisscross to enhance the mutual coupling between them. Interfering emissions received by the choke are greatly attenuated at relatively low frequencies by the choke acting as a pi section filter, and higher frequency emissions are attenuated by the choke action as a very lossy transmission line.

8 Claims, 3 Drawing Figures

LINE CHOKE

BACKGROUND OF THE INVENTION

This invention is directed to a choke for attenuating interfering emissions which could otherwise be transmitted over an AC power line.

Some electronic equipment generates interfering emissions which are transmitted partly in the form of radiated RF interference and partly in the form of high frequency transients on the AC power line connected to the equipment. Digital computers and other equipment using switching type power supplies are two prime examples of equipment which generates such interfering emissions.

It is well known that interference which is radiated or which is transmitted via an AC power line unnecessarily clutters the RF spectrum and can interfere with other equipment using RF receivers. Because of the widespread use of switching power supplies and small computers, video games and the like, governmental regulations now impose stricter limitations on the amount of interfering emissions which such devices may emit.

To reduce the amount of interfering emissions which are transmitted via the AC power line, various types of filters have been used. In some cases, a filter in the form of a bi-filar wound toroid has been included in the equipment's power line. Bobbin wound chokes using two "C" ferrite cores have also been used to limit the interference transmitted via a power line.

Although some attenuation of the interference is achieved, such conventional approaches are not believed sufficient to reduce the interference to the point presently mandated by government regulations. Moreover, such conventional chokes tend to be undesirably large and expensive.

OBJECTS OF THE INVENTION

It is a general object of the invention to provide an improved line choke.

It is a more specific object of the invention to provide a line choke which greatly attenuates interfering emissions in an AC power line, which is compact in size, and which is less expensive than conventional line chokes.

BRIEF DESCRIPTION OF THE FIGURES

The objects stated above and other objects of the invention are set forth more particularly in the following detailed description of the accompanying drawings, of which.

DESCRIPTION OF THE PREFERRED EMBODIMENT

Figure 1:
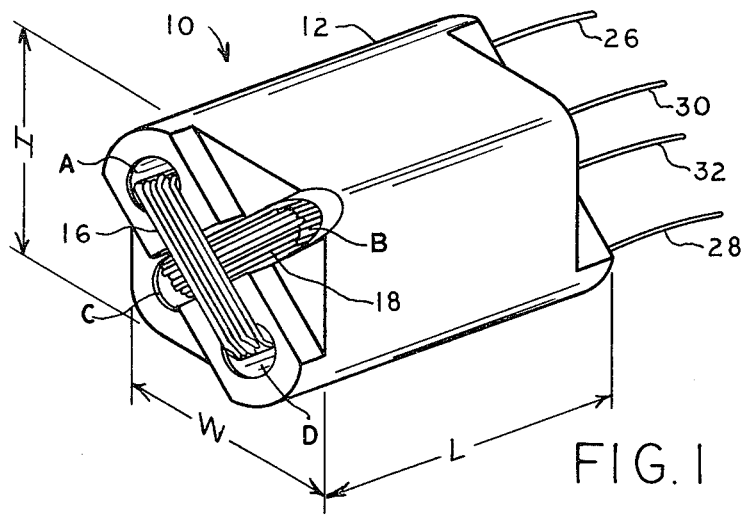
FIG. 1 is a perspective view of a preferred embodiment of a line choke according to the invention.

Referring to FIG. 1, a choke 10 is shown which is designed to be serially connected with the AC line which powers a piece of electronic equipment. The choke 10 attenuates interfering emissions generated by the equipment on the power line, and also inhibits interfering emissions from entering the equipment via its AC power line.

The illustrated choke is particularly adapted for use with the power supply of a small computer or other such device which generates interfering emission within a frequency range of from about 150 kilohertz to about 300 megahertz. To provide adequate attentuation over this frequency range, the choke 10 is constructed to act as a low pass pi section filter at frequencies from about fifty kilohertz to about one megahertz, and to act as a very lossy transmission line at frequencies above about one megahertz. In addition, this choke is designed to present a very low impedance to the AC current in the power line.

Figure 2:
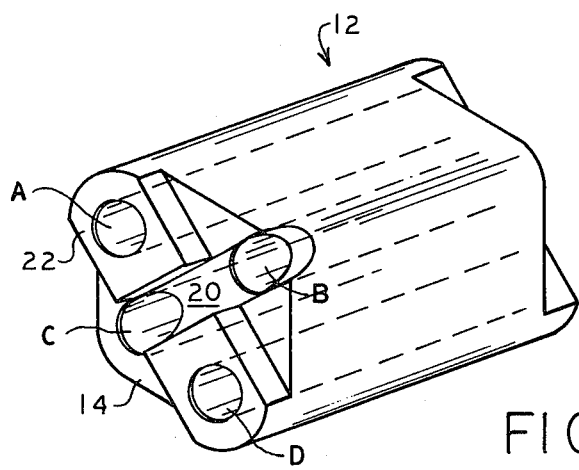
FIG. 2 is a perspective view of the line choke's core.

To achieve these and other objectives discussed below, the choke 10 includes a ferrite core 12 which may have a generally rectangular cross section with a width W, a height H and a length L. Extending completely through the core are four holes A, B, C and D (see FIG. 2 also). As viewed from the front end 14 of the core, these four holes are situated in a generally rectangular pattern for receiving a pair of windings 16 and 18.

Connecting the holes B and C is a groove 20. A similar groove (not shown) connects these holes on the opposite side of the core. A raised boss 22 projects from the front end 14 of the core around the hole A and a similar boss surrounds the hole D. The opposite ends of the core carry similar bosses.

To achieve the desired coupling between the windings, the winding 18 is threaded through the diagonally opposite holes B and C and around the center of the core. That is, the winding 18 is threaded through the hole B, around the back end of the core, and returned through the hole C from where it enters the hole B again. Multiple turns of the winding 18 are thus threaded around the center of the core by means of the holes B and C.

The winding 16 is threaded through the diagonally opposite holes A and B and around the center of the core similarly to the winding 18. Thus, as viewed from the front end of the core, the windings crisscross each other in a generally X-shaped pattern. This achieves a coupling coefficient of about 0.2 between the windings 16 and 18 when the choke is constructed of the materials described hereinafter.

The function of the grooves and bosses is to separate the windings 16 and 18 so as to achieve a breakdown voltage in excess of ten thousand volts between windings. This is achieved by passing the winding 18 through the groove 20 (and through the groove on the opposite side of the core) and passing the winding 16 over the bosses. In this manner, an insulating air gap separates the windings where they crisscross at the ends of the core.

In construction, the ferrite core may be made of nickel zinc, manganese zinc or any other suitable material. Preferably, manganese zinc is used and is selected to have an initial permeability of from 5 thousand to 10 thousand so that, at higher frequencies where the permeability of the core decreases, the choke acts as a very lossy transmission line. A ferrite material which serves this purpose is the K-960 material available from the Krystinel Corporation of Paterson, N.J.

The ferrite material described above is highly conductive. That is, it has a low volume resistivity. Hence, the windings must be electrically insulated from the core. Such insulation is preferably effected by coating the core with an insulating material such as a thirty micron coating poly-p-xylylene. Any suitable epoxy may also be used to insulate the windings from the core.

The transmission line impedance of the choke is controllable by the spacing between the holes A, B, C and D. These spacings are preferably selected so that an average impedance of about 100 ohms is provided at frequencies above about one megahertz. In the illustrated embodiment, this impedance level is achieved by a center-to-center separation of about 0.37 inch between holes A-B and C-D, and a center-to-center separation of about 0.32 inch between the holes A-C and B-D. Other dimensions may, of course, be used, depending on the particular application for which the choke is designed. For example, if it is desired to lower the transmission line impedance, the holes will be moved closer together. Moving the holes farther apart raises the impedance.

The dimensions of the illustrative core provide a width W of about 0.75 inch, a height H of about 0.69 inch, and a length L of about 1.12 inches. The diameters of the holes A-D may be about 0.18 inch, but may be made larger or smaller, depending on the clearance needed for a particular machine to thread the windings. None of these dimensions are critical in themselves. What is more important is that the volume of the core be sufficient to carry the expected current load of the choke without saturation. The dimensions stated above are adequate for an application in which the choke is expected to carry up to three amperes.

The windings 16 and 18 are preferably constructed of copper wires having substantially the same length and inductance for best transmission line characteristics. For example, the windings of the illustrative choke are each made of 14 turns of number 26 AWG wire and each provide an inductance of about 11 millihenries. With this size wire, a current handling capability of about 300 circular mils per ampere is provided.

As shown in FIG. 1, the four leads 26, 28, 30 and 32 associated with the windings 16 and 18 may be brought out through the holes in the back end of the core, or any of them may be brought out through the front end of the core.

Figure 3:
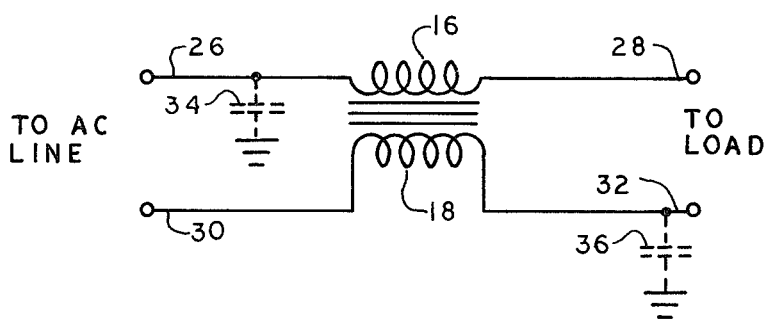
FIG. 3 schematically represents the line choke's windings.

To connect the choke with the power line and the equipment in which the coke is installed, the leads 26 and 30 may be coupled with the AC line as shown in FIG. 3. The leads 28 and 32 may be connected to a load which may be the power supply of the equipment. Capacitors 34 and 36 may be connected to the leads 26 and 32 as shown to aid in filtering interfering transmissions.

The choke described above is believed to attenuate interfering power line emissions to the extent required by all present U.S. and foreign regulations. It is particularly useful for attenuating such emissions when installed in home and small business computers, television receivers, and equipment having a switching type power supply.

Among the advantages of the choke is that it provides relatively high values of inductance with a relatively small number of turns in the windings. In addition, the DC resistance of the choke is very small (less than 0.1 ohm) to minimize the voltage drop across the choke, and the choke experiences but a small temperature rise under full current load conditions.

Moreover the relatively small physical size of the choke makes it easy to include in compact equipment. Of course, the choke is easily optimized for a particular application by selection of the appropriate ferrite core material, the number of turns in the windings, and the physical size of the core.

Another significant advantage is that the choke does not require shielding to prevent radiation or pick up of interfering emission in areas of high field intensity. The core material itself provides this function.

Although the invention has been described and illustrated in terms of a preferred construction, it will be obvious to those skilled in the art that many alterations and modifications may be made without departing from the invention. By way of example only, the core may be modified to have a cylindrical shape rather than the illustrated rectangular shape. In addition, the holes in the core may be positioned other than as shown, provided that they still cause the windings to crisscross. Many other such modifications will be apparent to those skilled in the art. Accordingly, it is intended that all such modifications and alterations be considered as within the spirit and scope of the invention as defined by the appended claims.

What is claimed is:

1. An AC power line choke comprising:
    a ferrite core having two opposite ends and including four holes therein which extend completely through the length of the core between said ends;
    a first winding threaded through a pair of said holes and wound around the center of the core; and
    a second winding threaded through the other pair of holes and wound around the center of the core such that the second winding crisscrosses the first winding for mutual coupling between the windings, each of said core ends having a groove connecting a pair of holes through which the first winding is threaded and having a raised boss over which the second winding is threaded so that the windings are separated by an insulating air gap where they crisscross at the ends of the core, the windings and the permeability of the core being selected so that, when the windings are coupled in series with a power line, interferring emissions on the power line are greatly attenuated without substantially attenuating AC power on the line.

2. A choke as set forth in claim 1 wherein said four holes are disposed in a generally rectangular pattern as viewed from the end of the core, wherein the first winding is threaded through two diagonally opposite holes, and wherein the second winding is threaded through the other two diagonally opposite holes so that the windings crisscross each other in an X-shaped pattern.

3. A choke as set forth in claim 1 wherein the two windings are selected to be of substantially the same length and to have substantially the same inductance.

4. An AC power line choke, comprising:
    a ferrite core having two opposite ends between which four holes extend completely through the core, the holes being disposed in a generally rectangular pattern as viewed from each end of the core, each end of the core having a groove connecting a first pair of diagonally opposite holes and a raised boss around the other pair of holes;
    a first winding threaded through the first pair of holes and around the center of the core so that the first winding lies in the grooves at the ends of the core; and
    a second winding threaded through the other pair of holes and wound around the center of the core so that the raised bosses separate the windings by an air gap at each end of the core and so that the windings crisscross each other in a generally X-shaped pattern, the spacing between the core holes being selected so that the choke operates as a lossy transmission line at frequencies above about one megahertz.

5. A choke as set forth in claim 4 wherein the core is constructed of manganese zinc ferrite material and is selected to have an initial permeability in the range of from five thousand to ten thousand.

6. An AC power line choke comprising:
a ferrite core having four holes therein which extend completely through the length of the core;
a first winding threaded through a pair of said holes and wound around the center of the core; and
a second winding threaded through the other pair of holes and wound around the center of the core such that the second winding crisscrosses the first winding for mutual coupling between the windings, and wherein the core material is selected to have an initial permeability such that the choke operates as a lossy transmission line above a given frequency range and the spacing between said four holes is selected to effect a transmission line impedance of about one hundred ohms at frequencies above about one megahertz so that, when the windings are coupled in series with a power line, interferring emissions on the power line are greatly attenuated without substantially attenuating AC power on the line.

7. A choke as set forth in claim 6 wherein the core is selected to have an initial permeability of from five thousand to ten thousand.

8. A choke as set forth in claim 7 wherein said core is constructed of manganese zinc ferrite material.

* * * * *